(12) United States Patent
Aoki et al.

(10) Patent No.: US 6,400,196 B1
(45) Date of Patent: Jun. 4, 2002

(54) SEMICONDUCTOR INTEGRATED CIRCUIT, LIQUID CRYSTAL APPARATUS, ELECTRONIC APPARATUS AND METHOD FOR TESTING SEMICONDUCTOR INTEGRATED CIRCUIT

(75) Inventors: Shigeki Aoki, Shiojiri; Haruo Kamijo, Nagano, both of (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/620,861

(22) Filed: Jul. 21, 2000

(30) Foreign Application Priority Data

Jul. 23, 1999 (JP) ............................. 11-209314
Jun. 7, 2000 (JP) ........................... 2000-170271
Jul. 13, 2000 (JP) ........................... 2000-212618

(51) Int. Cl.$^7$ ................................................ H03L 7/00
(52) U.S. Cl. ...................................... 327/143; 327/198
(58) Field of Search ............................... 327/141, 143, 327/198; 365/233, 201

(56) References Cited

U.S. PATENT DOCUMENTS 6,078,201 A * 6/2000 Crotty .......................... 327/333
6,111,441 A * 8/2000 Hartley et al. ............... 327/143

* cited by examiner

Primary Examiner—Dinh T. Le

(57) ABSTRACT

A semiconductor integrated circuit has a reset signal generation circuit (10) that generates a reset signal (12) having a reset period based on a power-on reset signal (11), and a latch circuit (20) having an initialization circuit (23) that initializes a latch output (21) based on the reset signal (12). The reset signal generation circuit (10) has a delay circuit (14) that can variably set a pulse width corresponding to the reset period of the reset signal (12). An output line of the delay circuit (14) is connected to a first pad terminal (32). An output line of the initialization circuit (23) is connected to a second pad terminal (34). When the semiconductor integrated circuit is verified, the first and second pad terminals (32, 34) are brought in contact with a probe (40). During this verification process, according to input/output loads of a tester that is connected to the first pad terminal (32), the pulse width of the reset signal (12) is set wider than that during the normal use when the pad terminals are not contacted with a probe.

25 Claims, 11 Drawing Sheets

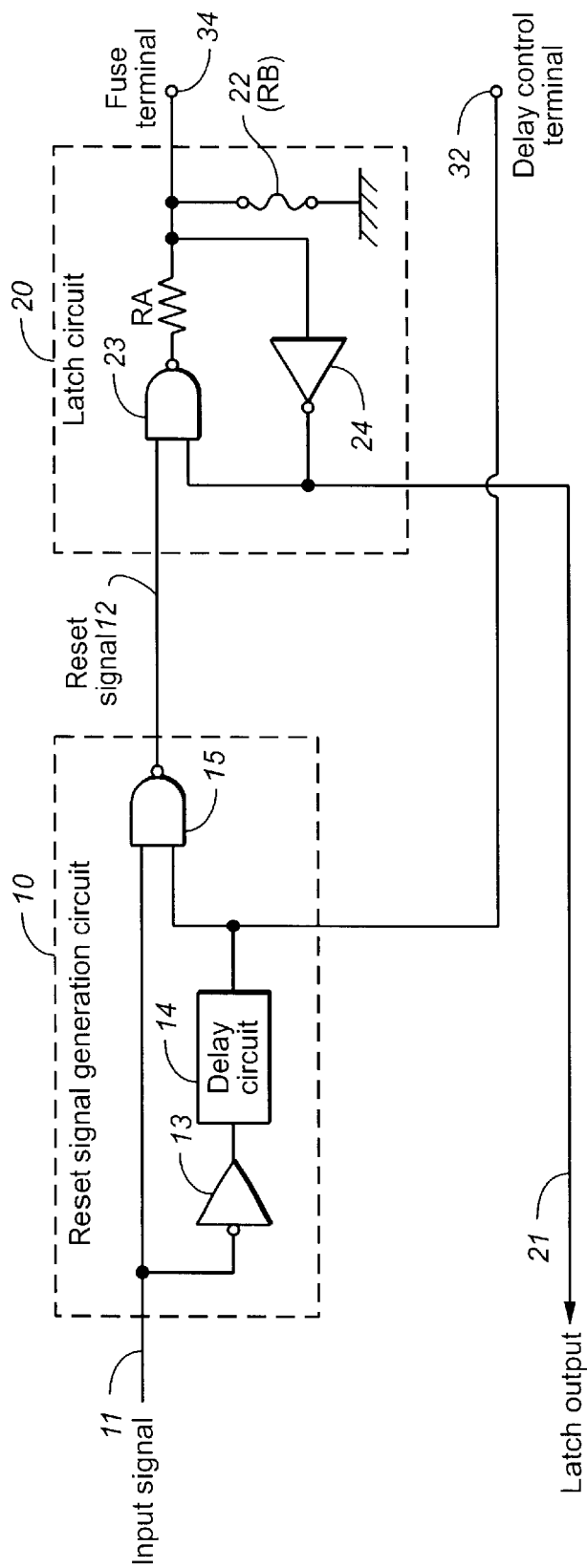
FIG._1

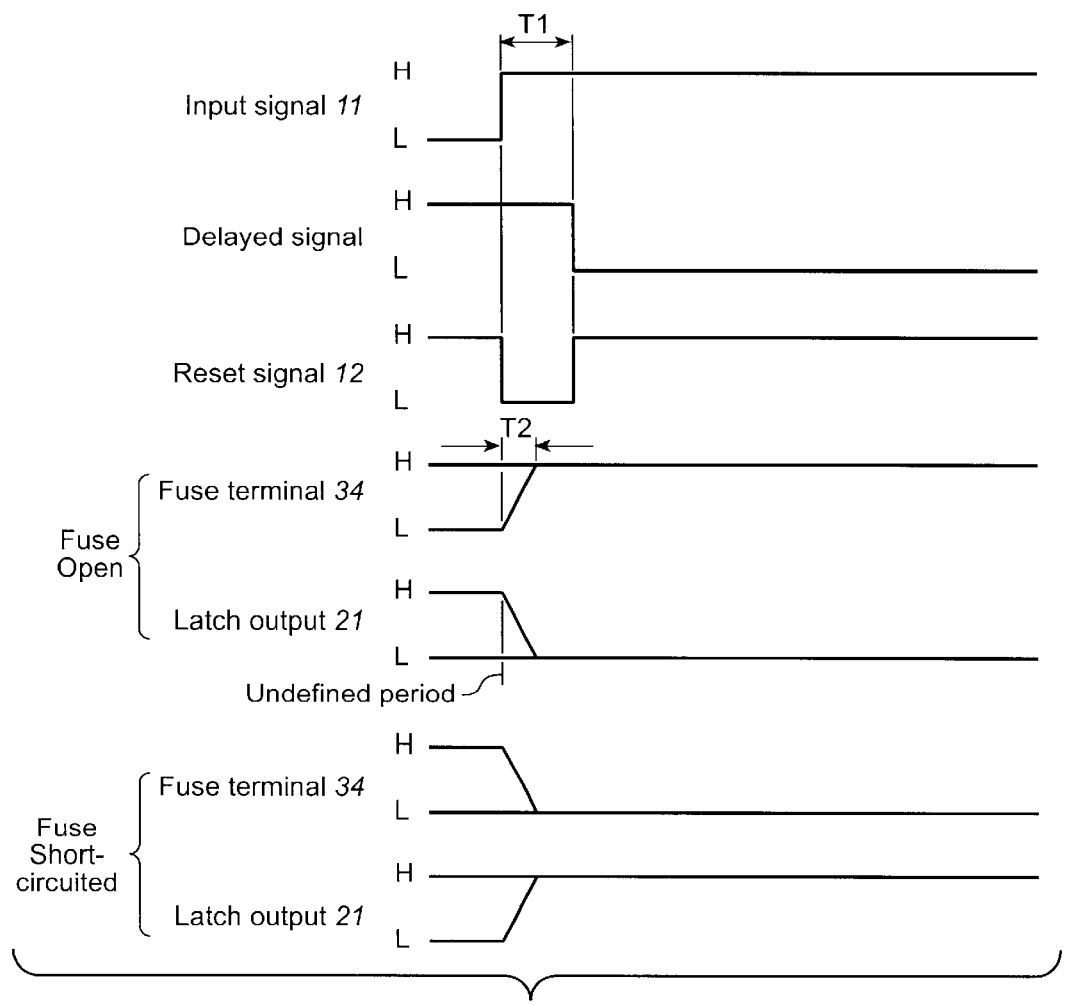
FIG._2
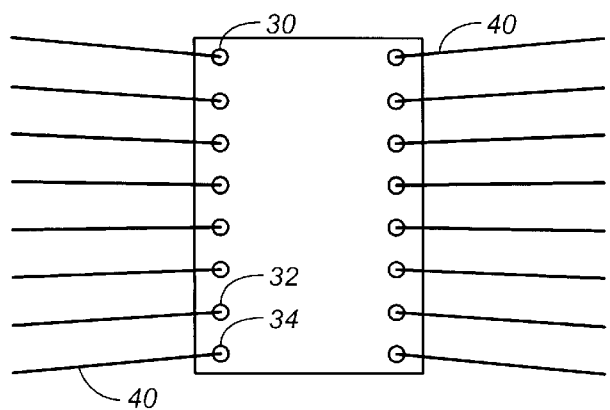
FIG._3

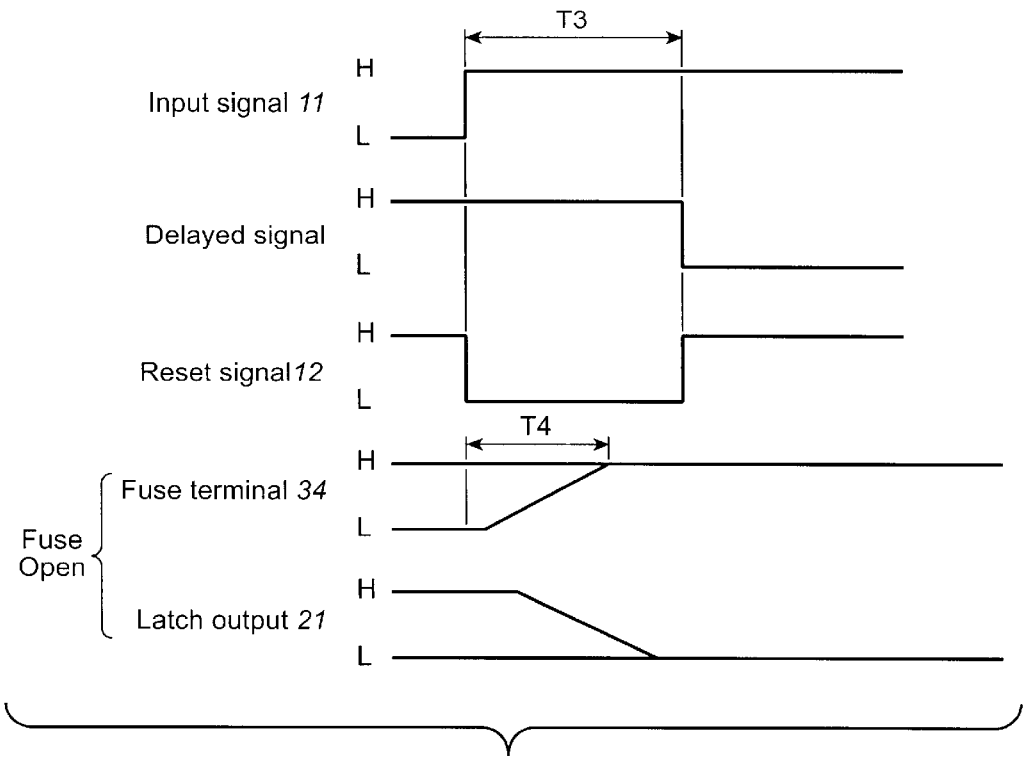
FIG._4
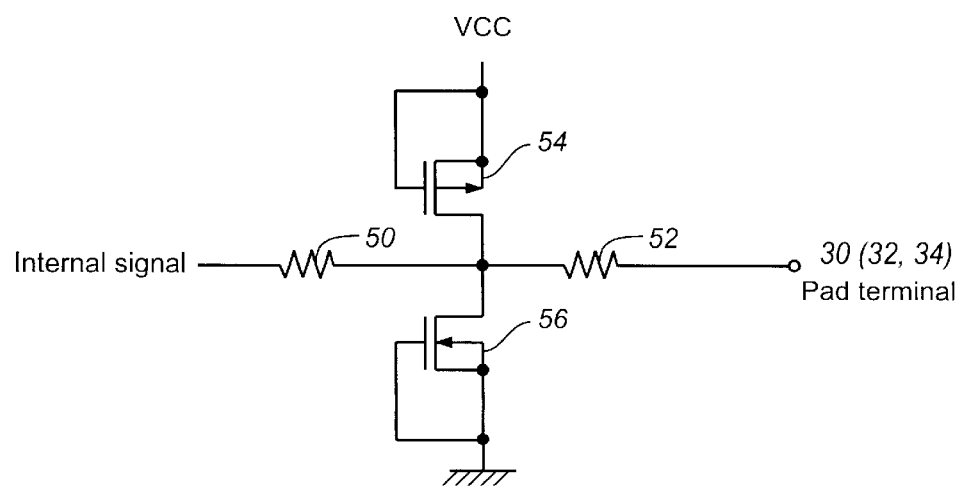
FIG._5

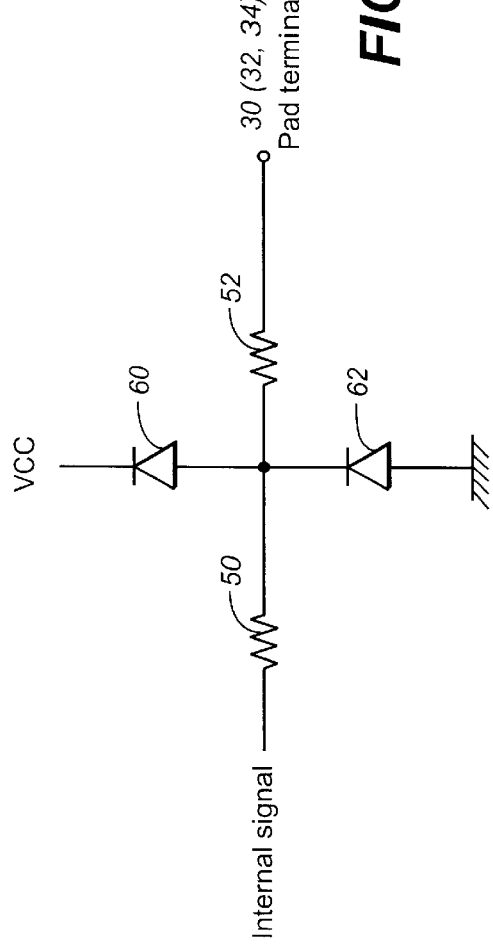
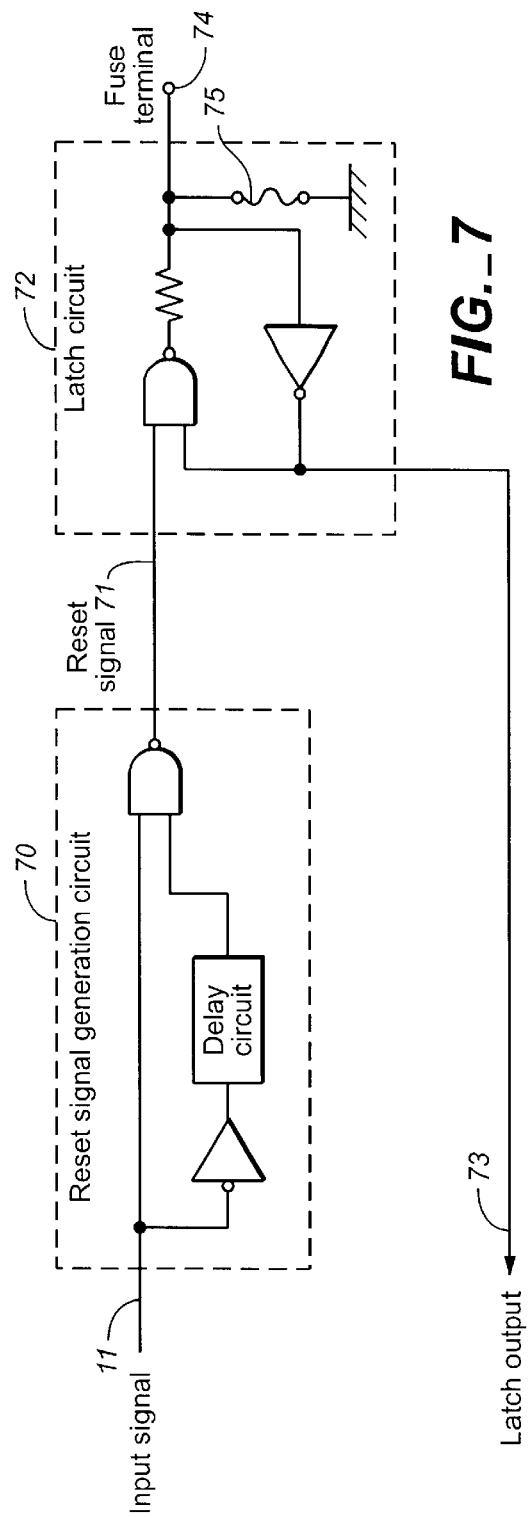
FIG._6
FIG._7

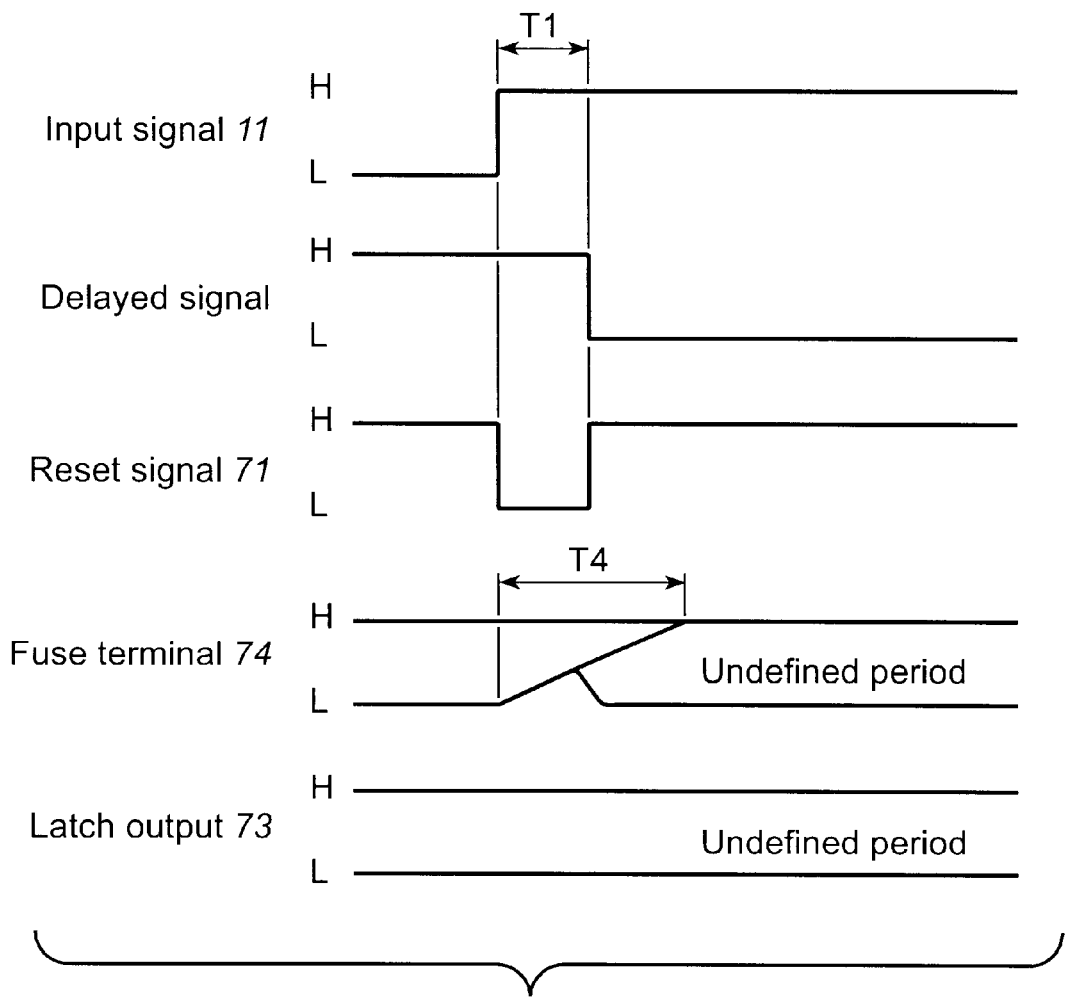
FIG._8

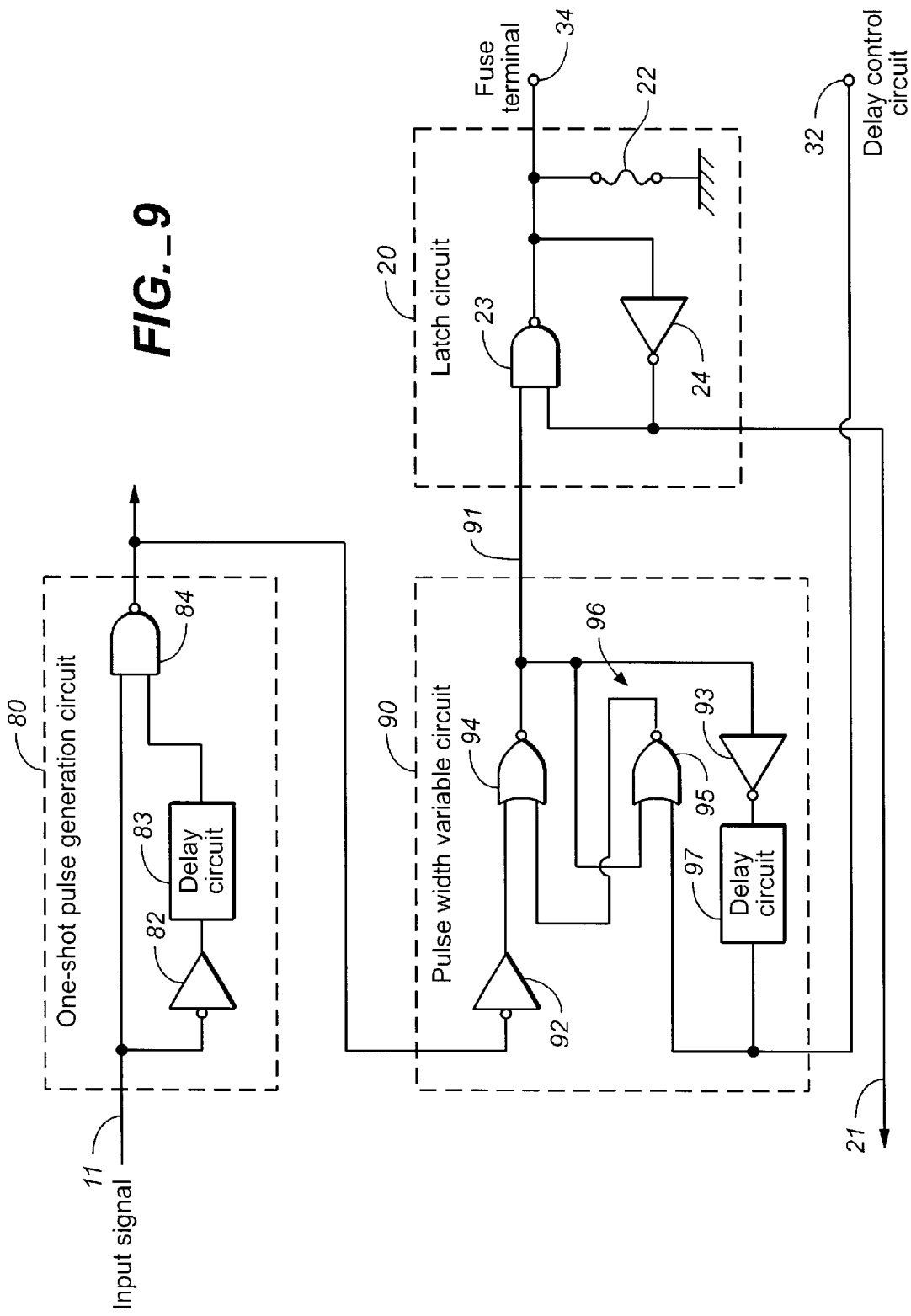
FIG._9

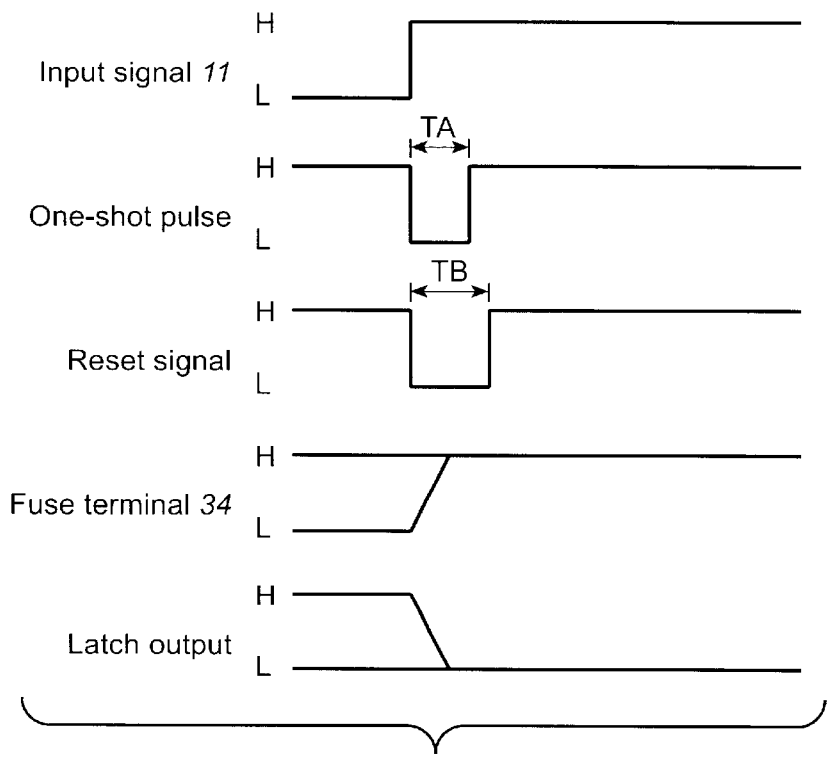
FIG._10
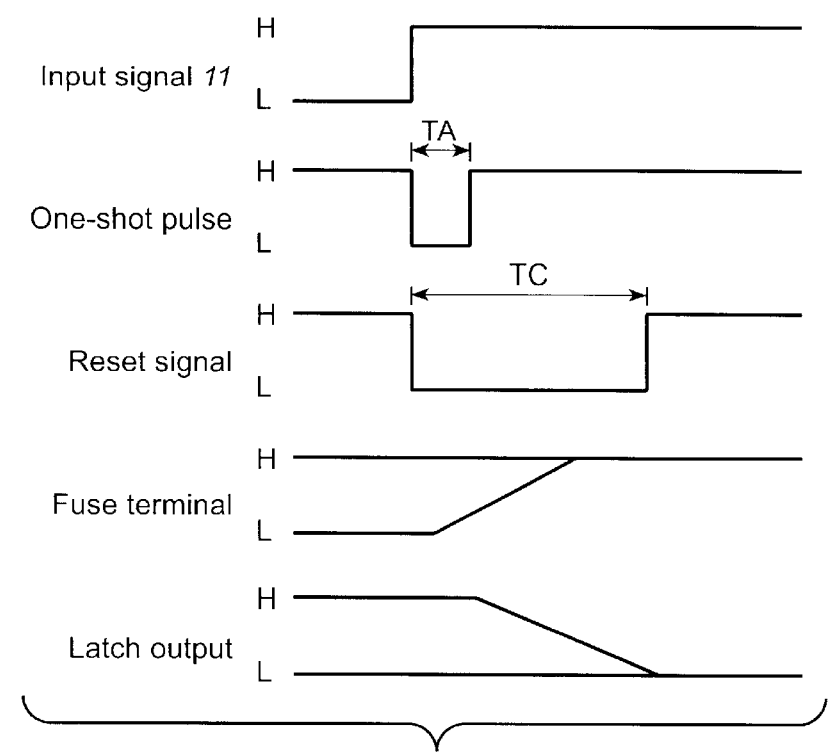
FIG._11

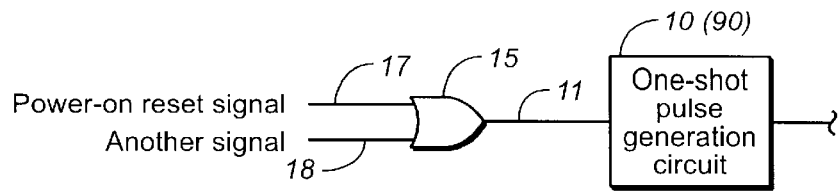
FIG._12
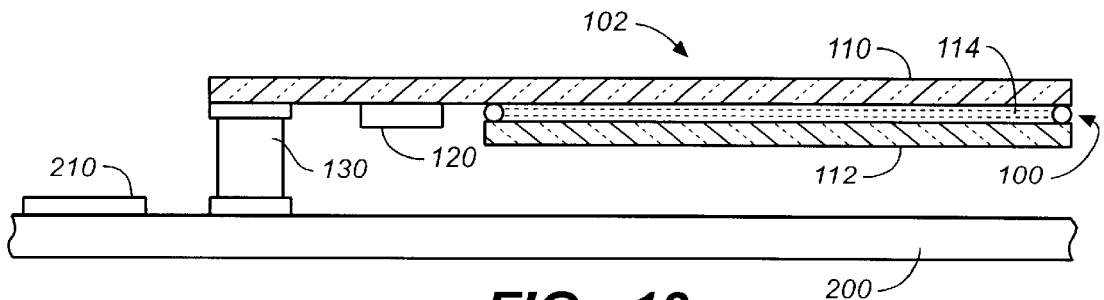
FIG._13
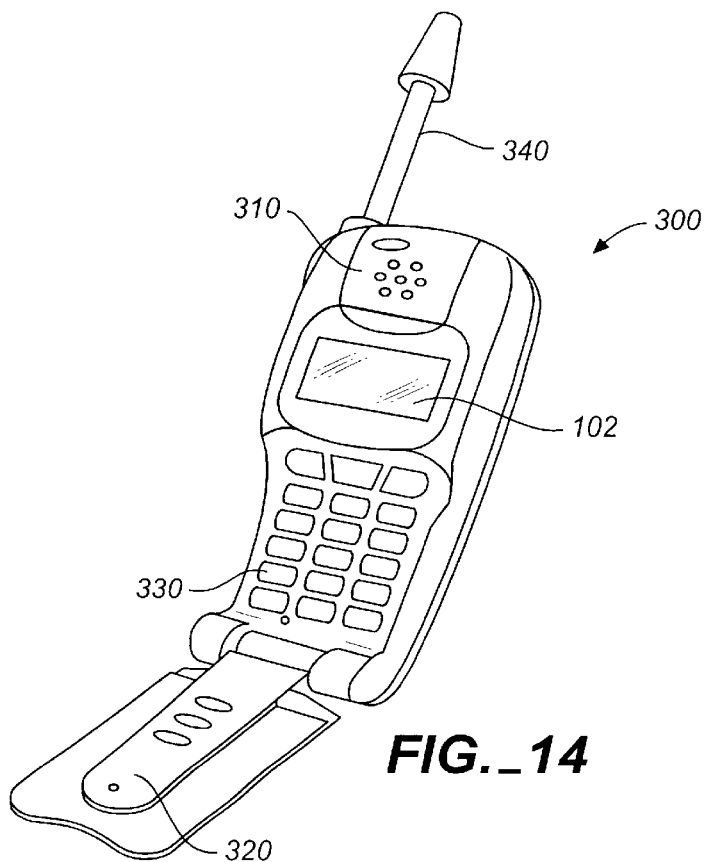
FIG._14

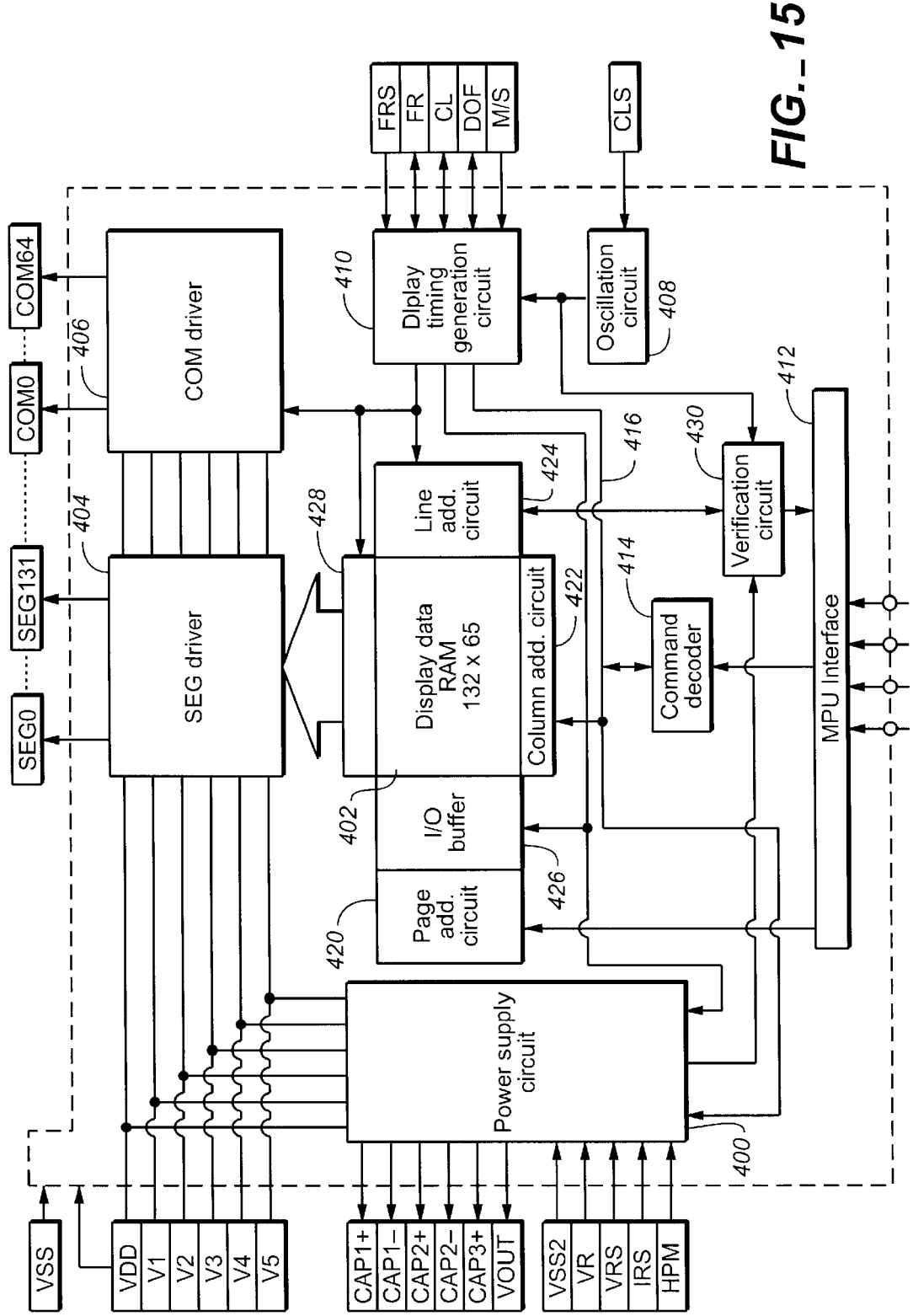
FIG._15

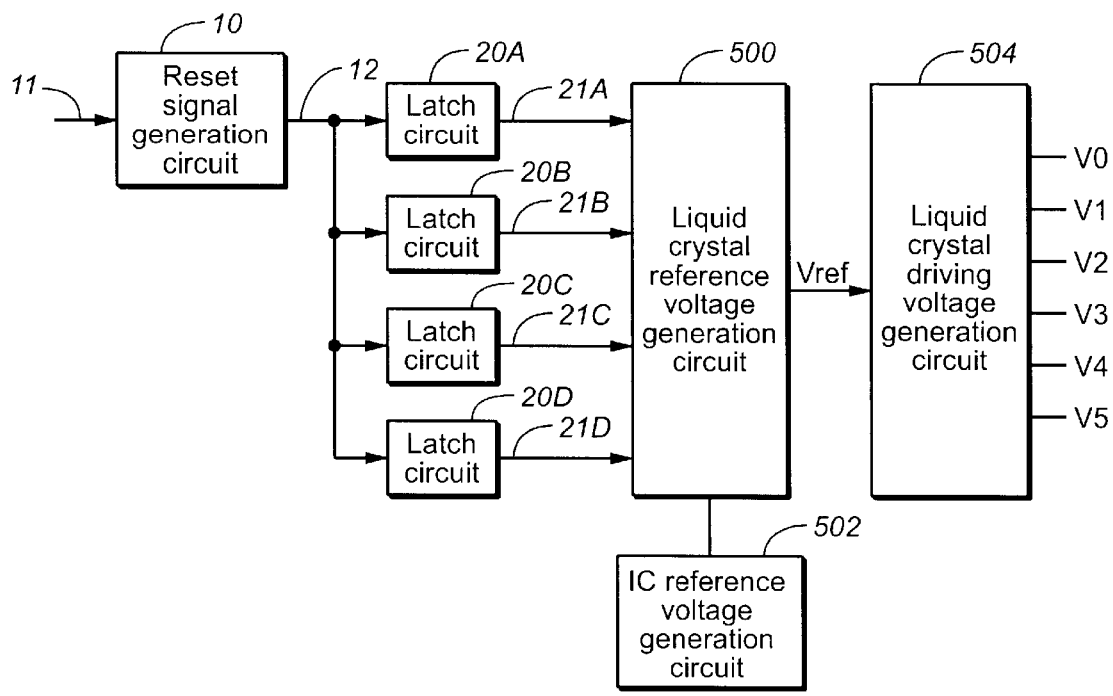
FIG._16
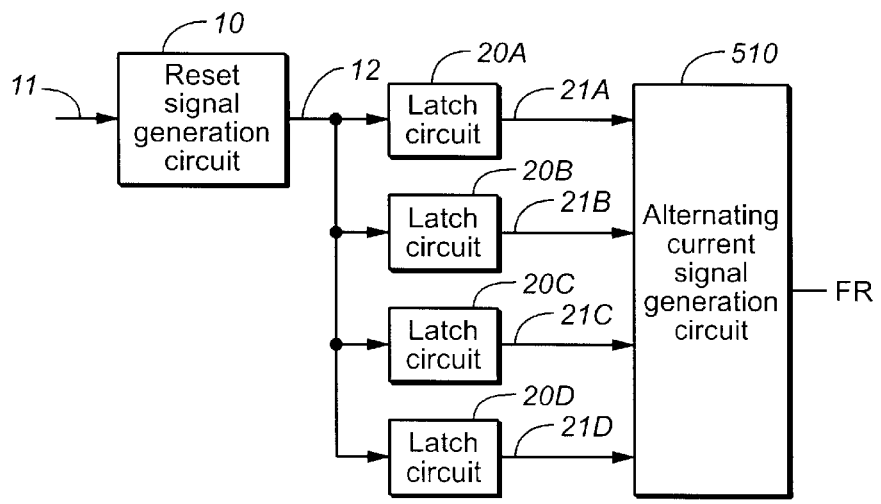
FIG._17

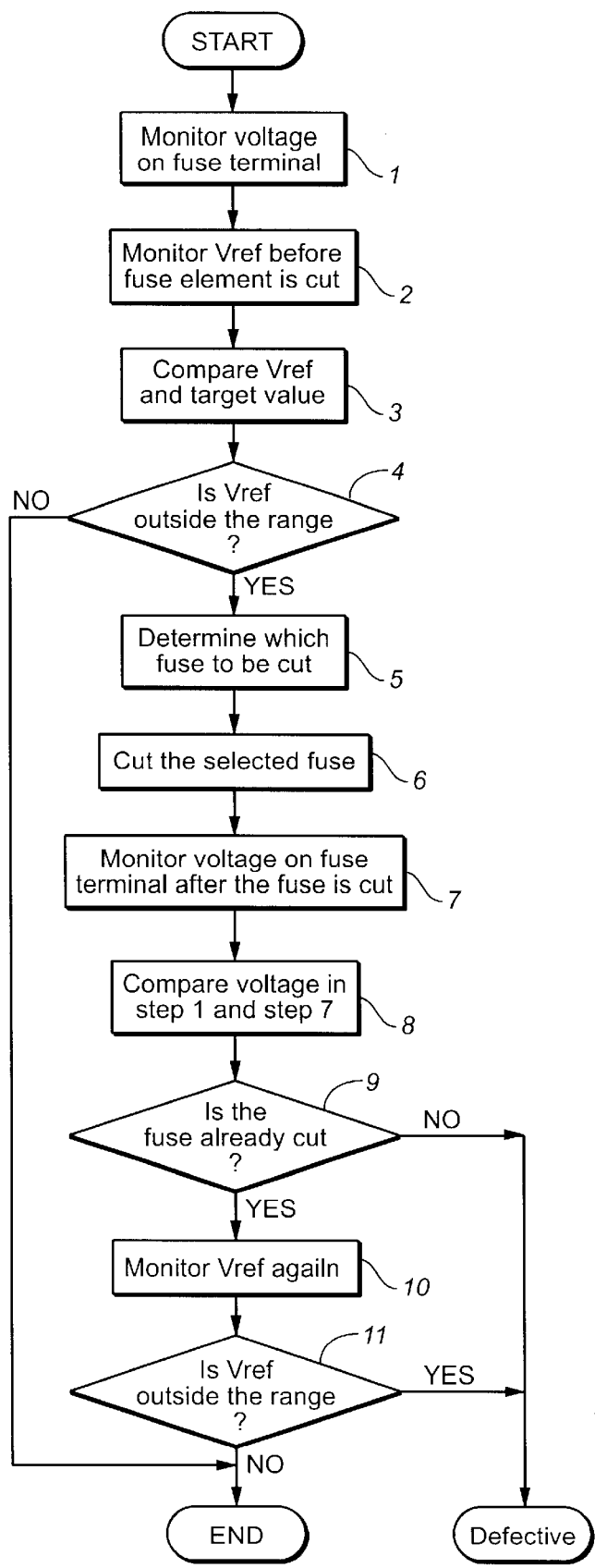
FIG._18

SEMICONDUCTOR INTEGRATED CIRCUIT, LIQUID CRYSTAL APPARATUS, ELECTRONIC APPARATUS AND METHOD FOR TESTING SEMICONDUCTOR INTEGRATED CIRCUIT

BACKGROUND OF THE INVENTION

1. Technical Field of the Invention

The present invention relates to a semiconductor integrated circuit, a liquid crystal apparatus, an electronic apparatus and a method for testing a semiconductor integrated circuit.

2. Technical Background and Problems to be Solved by the Invention

One of semiconductor integrated circuits of the type described above initializes an output of a latch circuit based on a power-on reset signal, for example. Voltage and frequency can be set based on an output of the latch circuit such that the semiconductor integrated circuit can properly operates. Semiconductor integrated circuits may have different performances because their device elements may differ from one another. In order to solve this problem, outputs of latch circuits are adjusted, for example, by cutting fuse elements to provide appropriate driving conditions for individual semiconductor integrated circuits before the semiconductor integrated circuits are shipped out from the factory.

Typically, a semiconductor wafer is set in a probe apparatus before the semiconductor wafer is cut into individual semiconductor integrated circuits and the adjustment described above is conducted. More specifically, probes are brought in contact with all of the pad terminals on the semiconductor wafer in the probe apparatus and an electrical measurement is conducted for each of the chips by a tester.

However, when the adjustment is conducted on the wafer, latch circuits in the semiconductor integrated circuits cannot be normally operated, and there are occasions where reference voltages and reference frequencies that are generated within the semiconductor integrated circuits cannot be adjusted to be within appropriate ranges.

The inventors of the present invention diligently searched for the reasons of such occurrences, and discovered that they result from differences in driving conditions of semiconductor integrated circuits between the time when the adjustment is conducted on the wafer and the time when the individual semiconductor integrated circuits are used.

Therefore, it is an object of the present invention to provide a semiconductor integrated circuit, a liquid crystal apparatus, an electronic apparatus and a method for adjusting semiconductor integrated circuits, in which a latch circuit can be properly operated even when driving conditions are different between the time when the adjustment is conducted on the wafer and the time when the semiconductor integrated circuit is used after shipment.

SUMMARY OF THE INVENTION

An semiconductor integrated circuit in accordance with one embodiment of the present invention comprises a reset signal generation circuit that generates a reset signal having a reset period based on an input signal that is inputted at least immediately after power is turned on, at least one latch circuit having an initialization circuit that initializes a latch output based on the reset signal, a first pad terminal that is connected to the reset signal generation circuit, and at least one second pad terminal that is connected to an output line of the initialization circuit. The reset signal generation circuit has a delay circuit that variably sets a pulse width corresponding to the reset period of the reset signal. The delay circuit variably changes the pulse width according to a load that is connected to the first pad terminal.

In accordance with the embodiment of the present invention, during a normal use period when a semiconductor integrated circuit is mounted in an electronic apparatus, the first and second pad terminals are not used and, therefore, no load is connected to these pad terminals. Accordingly, the initialization circuit takes a shorter time for its initialization operation, and a reset period that is set by the delay circuit is relatively short. When a semiconductor integrated circuit is verified, the first and second pad terminals are connected to a tester through the probes and cables, and therefore a load connected these pad terminals increases. Accordingly, the initialization circuit takes a longer time for its initialization operation, but a reset period that is accordingly set by the delay circuit becomes to be relatively longer. In either of the cases, the initialization operation can be conducted within the reset period, and an area for the delay circuit does not have to be increased.

The first pad terminal may be connected to an output line of the delay circuit. Alternatively, the first pad terminal may be connected to an input line of the delay circuit. This is because the delay circuit can change the pulse width depending on a load that is connected to the first pad electrode.

A fuse element may be connected to an output line of the initialization circuit, and a logic of the latch output may be determined based on an open state or a closed state of the fuse element.

A relationship of C1·R1>C2·R2 may preferably be established, when the reset signal generation circuit is formed from a plurality of circuit elements, where R1 is an output impedance of one of the circuit elements in a preceding stage of a position where the first pad terminal is connected, C1 is a load capacitance that is connected to the first pad terminal, R2 is an output impedance of the initialization circuit, and C2 is a load capacitance that is connected to the second pad terminal.

As a result, the reset period is securely set to be longer than the operation time that is required by the initialization circuit for its initialization.

The reset signal generation circuit may include a one-shot pulse generation circuit that generates a one-shot reset signal having a pulse width corresponding to the reset period based on an input signal and a delay signal that is formed by delaying the input signal by the delay circuit.

Instead of the above, the reset signal generation circuit may include a one-shot pulse generation circuit that generates a one-shot pulse based on an input signal, and a pulse width variable circuit that includes a delay circuit and changes the pulse width of the one-shot pulse according to a load that is connected to the first pad terminal.

The input signal may preferably be inputted in the reset signal generation circuit a plurality of times during a period from a time immediately after the power supply is turned on to a time when the power supply is turned off. There may be a case where an initialized latch data may change due to noises or the like. In such a case, a latch output can be re-initialized based on an input signal that is inputted after the latch data is changed.

In this connection, a logic sum circuit (OR) circuit may preferably be provided to take a logic sum of a power-on reset signal and another signal. An output signal of the OR circuit may be inputted in the reset signal generation circuit. As a result, deteriorating effects of the noises can be eliminated.

The semiconductor integrated circuit may be provided with a reference voltage generation circuit that generates a reference voltage based on a latch output that is securely initialized in the manner described above. Furthermore, the semiconductor integrated circuit may be provided with a liquid crystal driving voltage generation circuit that generates a liquid crystal driving voltage in a plurality of levels based on an output voltage from the reference voltage generation circuit. The liquid crystal driving voltage directly affects the image quality, and thus requires a high level of accuracy. A highly accurate liquid crystal driving voltage can be generated by the present invention.

In addition, the semiconductor integrated circuit may be provided with a reference frequency generation circuit that generates a reference frequency based on a latch output that is securely initialized in the manner described above. Furthermore, an output frequency of the reference frequency generation circuit may be used as an alternating signal that alternately drives the liquid crystal. The frequency of the alternating signal for the liquid crystal affects flickering of the display screen and thus requires a high level of accuracy. By the present invention, a highly accurate alternating signal can be generated.

A liquid crystal apparatus may be composed by a liquid crystal driver IC that is formed from the semiconductor integrated circuits described above and a liquid crystal panel that is driven by the liquid crystal driver IC. As a result, a liquid crystal display is realized with a high image quality and a less flickering. Also, the liquid crystal apparatus can be used as a display unit for a variety of electronic apparatuses.

In accordance with another embodiment of the present invention, a method for verifying a semiconductor integrated circuit comprises a first step of contacting a probe with a plurality of pad terminals of the semiconductor integrated circuit, a second step of generating, by a reset signal generation circuit in the semiconductor integrated circuit, a reset signal having a pulse width that is determined according to a load connected to a first pad terminal of the plurality of pad terminals, a third step of initializing a latch output, in at least one latch circuit having an initializing circuit, by the initializing circuit based on the reset signal, and a fourth step of monitoring an output voltage of the initialization circuit through a second pad terminal among the plurality of pad terminals.

In accordance with the method of the present invention, the reset period can be set longer than the time that is required by the initialization circuit for its initialization operation, in the same manner that may be achieved when the verification of the apparatus of the present invention is conducted.

A fifth step may be provided for monitoring a reference signal (voltage, frequency, etc.) that is set based on an initialized latch output. As a result, the electric characteristics of the semiconductor integrated circuit can be examined.

Furthermore, a sixth step may be provided for cutting a fuse element that is connected to an output line of the initialization circuit based on a monitoring result conducted in the fifth step. The fuse element may be cut to adjust and eliminate variations in semiconductor integrated circuits.

After the sixth step, a seventh step may be provided for monitoring through the second pad terminal an output of the initialization circuit that is modified by the cut fuse element. By conducting the seventh step, a determination can be made as to whether or not the fuse element is cut.

The reference signal that is monitored in the fifth step can be used as a reference voltage for generating liquid crystal driving voltages in a plurality of levels, or as an alternating signal for alternately driving the liquid crystal.

FIG. 1 shows a circuit diagram of a main part of a semiconductor integrated circuit in accordance with a first embodiment of the present invention.

FIG. 2 shows a timing chart for explaining an operation of the semiconductor integrated circuit shown in FIG. 1 during the normal use.

FIG. 3 is a plan view for explaining a verification step for verifying the semiconductor integrated circuit shown in FIG. 1 in the state of a semiconductor wafer.

FIG. 4 shows a circuit diagram of one example of an electrostatic protection circuit that is connected to a pad terminal of the semiconductor integrated circuit shown in FIG. 1.

FIG. 5 shows a circuit diagram of another example of an electrostatic protection circuit that is connected to a pad terminal of the semiconductor integrated circuit shown in FIG. 1.

FIG. 6 shows a circuit diagram of another example of an electrostatic protection circuit that is connected to a pad terminal of the semiconductor integrated circuit shown in FIG. 1.

FIG. 7 shows a circuit diagram of an example semiconductor integrated circuit to be compared with the one shown in FIG. 1.

FIG. 8 shows a timing chart that explains the operation of the semiconductor integrated circuit shown in FIG. 7 in the verification process.

FIG. 9 shows a circuit diagram of a main part of a semiconductor integrated circuit in accordance with a second embodiment of the present invention.

FIG. 10 shows a timing chart that explains the operation of the semiconductor integrated circuit shown in FIG. 9 in the normal use.

FIG. 11 shows a timing chart that explains the operation of the semiconductor integrated circuit shown in FIG. 9 in the verification process.

FIG. 12 shows a circuit diagram of a main part of a semiconductor integrated circuit in accordance with a third embodiment of the present invention.

FIG. 13 schematically shows a liquid crystal apparatus that is provided with a semiconductor integrated circuit of the present invention.

FIG. 14 is a schematic perspective view of a cellular phone that is one example of an electronic apparatus in which the liquid crystal apparatus shown in FIG. 13 is mounted.

FIG. 15 shows a block diagram of a liquid crystal driver IC that is mounted on the liquid crystal apparatus shown in FIG. 13.

FIG. 16 shows a circuit that is mounted in a power supply circuit shown in FIG. 15.

FIG. 17 shows a circuit that is mounted in a oscillation circuit shown in FIG. 15.

FIG. 18 shows a flow chart of the operation steps of the circuit shown in FIG. 16 during the verification process.

DETAILED DESCRIPTION

Embodiments of the present invention will be described below with reference to the accompanying drawings.

FIG. 1 shows a main part of a semiconductor integrated circuit in accordance with a first embodiment of the present invention. The semiconductor integrated circuit shown in FIG. 1 has a reset signal generation circuit 10 and a latch circuit 20. The reset signal generation circuit 10 is formed from a one-shot pulse generation circuit. As shown in FIG. 2, an input signal (for example, power-on reset signal) 11 that is provided immediately after the power supply is turned on is inputted in the reset signal generation circuit 10. Then, a reset signal 12 having a reset period T1 during which the signal level becomes LOW as shown in FIG. 2 is outputted from the reset signal generation circuit 10. The reset signal generation circuit 10 includes an inverter 13, a delay circuit 14 and a NAND gate 15. An input signal 11 is inputted in one input terminal of the NAND gate 15, and a delay signal (see FIG. 2) which is the input signal 11 that passes through and is delayed by the inverter 13 and the delay circuit 15 is inputted in the other input terminal of the NAND gate 15. Therefore, as shown in FIG. 2, the reset signal 12 that is an output of the NAND gate 15 becomes a one-shot pulse having a reset period T1 during which the level thereof is LOW from a rising edge of the input signal 11 to a rising edge of the delay signal.

The latch circuit 20 provides a logic as a latch output 21 that is representative of a short state or an open state of a fuse element 22. The latch circuit 20 has, in addition to the fuse element 22, a NAND gate 23 that functions as an initialization circuit, and an inverter 24 that inverts the potential on an output line of the NAND gate 23 to provide the latch output 21. The resent signal 12 and the latch output 21 are inputted in the NAND gate 23.

The fuse element 22 is connected between an output line of the NAND gate 23 and the grounding. The fuse element 22 is typically formed from polysilicon, aluminum or the like. The fuse element 22 is used to provide characteristic data for each semiconductor integrated circuit. When the semiconductor integrated circuit is examined, the fuse element 22 may be maintained in a short-circuited state or the fuse element 22 may be placed in an open state by melting and cutting the fuse element 22 by Joule heat that may be generated by a high voltage, for example. In this manner, the fuse element 22 can be placed in either the short-circuited state or the open state, and the logic of the latch output 21 is determined by either of the states.

Also, the semiconductor integrated circuit shown in FIG. 1 is equipped with numerous pad terminals 30, as shown in FIG. 3. However, FIG. 1 shows two pad terminals that are used solely by the semiconductor manufacturer. One of them is a delay control terminal (first pad terminal) 32, and the other is a fuse terminal (second pad terminal) 34.

The delay control terminal 32 is connected to, for example, an output line of the delay circuit 14 of the reset signal generation circuit 10. The fuse terminal 34 is connected to an output line of the NAND gate 23, for example. All of the pad terminals including the delay control terminal 32 and the fuse terminal 34 are brought in contact with probes 40, as shown in FIG. 3, when semiconductor integrated circuits in the state of a semiconductor wafer are examined. However, the customer who purchased the semiconductor integrated circuit shown in FIG. 1 would not use the delay control terminal 32 or the fuse terminal 34.

During the normal use of the semiconductor integrated circuit after it is mounted on an electronic apparatus, no load is connected to the delay control terminal 32 or the fuse terminal 34. The operation during the normal use will be described below.

The latch output 21 from the latch circuit 20 is not stable because it is at either HIGH or LOW, when the power supply to the semiconductor integrated circuit is turned on. Therefore, for example, the power-on reset signal that is inputted immediately after the power supply is turned on is provided as the input signal 11 to thereby initialize the latch output 21.

The reset signal generation circuit 10 generates the reset signal 12 based on the input signal 11. During the normal use, the amount of delay applied to the input signal 11 by the delay circuit 14 is determined depending on delay elements such as inverters that form the delay circuit 14. This is because the delay control terminal 32 is not connected to a load. The reset signal 12 that is outputted from the reset signal generation circuit 10 during the normal use has a reset period T1 at LOW level.

The reset signal 12 is inputted in the NAND gate 23 of the latch circuit 20. When the reset signal 12 is at LOW level, an output from the NAND gate 23 always becomes be to at HIGH level without regard to the logic of the latch output 21. The output potential of the NAND gate 23 (potential on the fuse terminal 34) is not defined at the time when the power supply is turned on. However, if the output potential is at LOW level, it is raised to HIGH level, as shown in FIG. 2.

Time T2 is required for the potential on the fuse terminal 34 to rise from LOW level to HIGH level (see FIG. 2). Time T2 depends on the time constant τ that is determined by an output impedance of the NAND gate 23, and a parasitic capacitance and a load capacitance that are connected to the output line of the NAND gate 23. In the normal use, the fuse terminal 34 is not connected with a load, and therefore time T2 is relatively short. As a result, the potential on the fuse terminal 34 is initialized within the reset period T1 with a leeway.

When the fuse element 22 is in the open state, an output (HIGH) from the NAND gate 23 is inverted by the inverter 24, so that the latch output 21 is initialized to LOW level. In this respect, the NAND gate 23 forms an initialization circuit. After the initialization, the latch output 21 is maintained to be at LOW level, even when the reset signal 12 changes from LOW level to HIGH level.

On the other hand, in contrast to the above, when the fuse element 22 is in the short-circuited state, the latch output 21 needs to be at HIGH level. Since the output line of the NAND gate 23 is grounded, an input at LOW level is inputted in the inverter 24, such that its inverted output, namely, the latch output 21 becomes to be at HIGH level.

More specifically, as shown in FIG. 2, when the reset signal 12 is at LOW level, an output from the NAND gate 23 becomes to be at HIGH level, in the same manner as describe above. On the other hand, since the fuse element 22 is in the short-circuited state, the output line of the NAND gate 23 is grounded through the fuse element 22. When an output from the NAND gate 23 is at HIGH level, an output impedance is $R_A$, and the resistance value of the fuse element 22 is $R_B$, as shown in FIG. 1, the following relation is established between the voltage V1 on the fuse terminal 34 and the output voltage V2 from the NAND gate 23:

$$V1=V2 \cdot R_B/(R_A+R_B)$$

The resistance value $R_B$ of the fuse element 22 may be in a range between several hundredΩ and several KΩ in order to readily melt and cut the fuse element 22. In order to make an input in the inverter 24 to be at LOW level, it is understood from the above relation that the output impedance $R_A$ of the NAND gate 23 should be set sufficiently higher than the resistance value $R_B$ of the fuse element 22.

It is noted that, after the latch output 21 is initialized to be at HIGH level, the latch output 12 is maintained at HIGH level even when the reset signal changes from LOW level to HIGH level.

In this manner, the latch output 21 that is undefined at the time when the power supply is turned on is initialized by the NAND gate 23 that functions as an initializing circuit. If the fuse 22 is in the open-state, the latch output 21 becomes to be at LOW level, and if the fuse 22 is in the short-circuited state, the latch output 21 becomes to be at HIGH level.

Accordingly, by using the latch output 21, characteristic data for a semiconductor integrated circuit corresponding to the short-circuited state or the open-state of the fuse element 22 can be set. The detail thereof will be described below.

The reset period T1 in the normal use can be set relatively short in association with the operation time T2 of the NAND gate 23. A shorter reset period T1 is effective in reducing the power consumption, because an electric current path is formed from the power supply source to the NAND gate 23 to the fuse element 22 and to the grounding during the reset time T1 when the fuse element 22 is in the short-circuited state. Furthermore, there are other advantages. For example, because the reset period T1 is short, the circuit size of the delay circuit 14 does not have to be made large, and an area occupied by the delay circuit 14 can be made relatively small.

Semiconductor integrated circuits are verified for their electrical characteristics by a probe apparatus while they are formed on a semiconductor wafer without having being cut into individual pieces. As shown in FIG. 3, all of the pad terminals 30, 32, 34 . . . of a semiconductor integrated circuit are brought in contact with the probes 40.

Each of the probes 40 is connected to a tester by means of a long wiring path, such as a cable. Therefore, the delay control terminal 32 and the fuse terminal 34 are connected with a large load, unlike in the normal use. The load includes wiring capacitances of the probe and the cable and input/output capacitances of the tester.

Due to the load connected to the fuse terminal 34, a longer operation time of the latch circuit 20 is required. As a result, the operation of the latch circuit 20 may not be completed within the reset period T1 shown in FIG. 2 that is used for the normal use.

For the reasons described above, the output impedance $R_A$ of the NAND gate 23 is set sufficiently higher than the resistance value $R_B$ of the fuse element 22. The time constant τ is defined as τ=C (capacitance)×R (resistance value). When the resistance value (output impedance $R_A$) among the time constant τ is larger, an absolute amount of the change of the time constant τ resulting from the change of the capacitance (C) becomes larger.

Therefore, when the output line of the NAND gate 23 is connected with a load capacitance through the fuse terminal 34, in addition to a parasitic capacitance of an electrostatic protection circuit (not shown) (the detail thereof will be described below), the operation time at the NAND gate 23 substantially increases.

Accordingly, in the semiconductor integrated circuit shown in FIG. 1, a delay time that is determined by the parasitic capacitance and the load capacitance added to the delay control terminal 32 is also added to the delay time set by delay elements such as multiple-stage inverters that form the delay circuit 14. As a result, the reset period of the reset signal 12 is set to period T3 shown in FIG. 4, that is longer than period T1 shown in FIG. 2.

FIG. 4 shows a timing chart illustrating an initial operation of the latch output 21 when the fuse element 22 is in the open state.

As shown in FIG. 4, when the delay control terminal 32 is in contact with the probe 40, the reset period T3 of the reset signal 12 that becomes LOW after the input signal 11 becomes HIGH is longer than the reset period T1 shown in FIG. 2.

When the fuse terminal 34 is in contact with the probe 40, time T4 is required for an undefined potential at a LOW level on the fuse terminal 34 at the time when the power is turned on to rise to a HIGH level by the operation of the NAND gate 23, as shown in FIG. 4. Time 4 is longer than the corresponding time T2 in the normal use shown in FIG. 2.

However, in the present embodiment, the reset period T3 is set longer than the operation time T4 of the latch circuit 20. As a result, the undefined potential at a LOW level on the fuse terminal 34 can be raised to a HIGH level within the reset period T3.

In a similar manner, the latch output 21 that is obtained by inverting an output of the NAND gate 23 can be initialized from an undefined potential HIGH to a LOW level within the reset period T3.

Therefore, in accordance with the present embodiment, by setting the reset period T1 for the normal use at a minimum required level, the latch circuit 20 can stably operate even when load capacitances of the probe 40, the cable and the tester are added to the fuse terminal for the verification of the semiconductor integrated circuit.

First, parasitic capacitances will be explained. A semiconductor integrated circuit is manufactured according to extremely fine rules, and therefore requires a protection circuit against external static electricity. FIG. 5 shows one example of an electrostatic protection circuit that uses a GCD (Gate Controlled Diode). As shown in FIG. 5, the pad terminals 30, 32 and 34 shown in FIG. 3 are connected to protection resistances 50 and 52 that are formed by high-impurity diffusion layers, and protection transistors 54 and 56 having wide gates, typically, of about several hundred μm in order to provide a sufficient dielectric strength against static electricity.

The parasitic capacitance C (junction capacitance in the semiconductor on silicon) of the protection transistors 54 and 56 is calculated by the following formula:

$$C = \sqrt{\frac{\epsilon_{si} \cdot \epsilon \cdot q \cdot N_D}{2(V_A + V_B)}}$$

where,

∈si dielectric constant of silicon (Si)

∈: dielectric constant of vacuum q: electric charge $N_D$: Concentration of acceptor $V_A$: Work function difference between junctions $A_B$: Bias The parasitic capacitance C i s calculated according to the above formula. First, the capacitance C per unit area upon the application of 3V is typically about 0.01–0.05 pF/mm². The parasitic capacitance C of the protection transistor with W=500 μm is about 0.01–0.05 pF, assuming that the drain area is 500 μm×3 μm.

The parasitic capacitance C varies depending on variations in the process for manufacturing semiconductor integrated circuits. Therefore, when the semiconductor integrated circuit is operated at a high speed of 10–100 MHz, in other words, when the pulse width of the reset signal 12 is about several tens of nanoseconds to several hundreds of nanoseconds, the parasitic capacitance C cannot be ignored as a time constant. Furthermore, since the miniaturization of the semiconductor process has been further advanced in recent years, electrostatic protection circuits require higher dielectric strength, and the parasitic capacitance C unavoidably becomes larger.

FIG. 6 shows an electrostatic protection circuit that uses diodes 60 and 62. The diodes 60 and 62 occupy an area of about several hundred $\mu m^2$, and therefore its parasitic capacitance C at a high-speed operation cannot be ignored, in the same manner as in the case of the electrostatic protection circuit of FIG. 5.

The load capacitance that is connected to the pad terminals 30, 32 and 34 will be explained below.

The pad terminals 30 and 32 are required for electrical measurement of the semiconductor integrated circuit. For the verification of the semiconductor integrated circuit, the pad terminals 30 and 32 are connected to an LSI tester through the probes 40 and cables. The input/output capacitance of the LSI tester is typically 10 pF–100 pF, that becomes a load capacitance.

In order to operate the latch circuit 20 for the verification, a longer operation time becomes necessary due to the large load capacitance, as described above. In this respect, the present embodiment is provided with the delay control terminal 32. At the time of the verification, the delay control terminal 32 is also contacted with the probe 40 to thereby set the reset period of the reset signal 12 longer according to the load capacitance that is connected to the delay control terminal 32.

Let us assume that the output impedance of the delay circuit 14 shown in FIG. 1 is R1, the load capacitance that is connected to the delay control terminal 32 is C1, the output impedance of the NAND gate 23 is R2, and the load capacitance that is connected to the fuse terminal 34 is C2. If a relation C1·R1>C2·R2 is established, the periods T3 and T4 shown in FIG. 4 have a relation T3>T4 during the verification process, and therefore the malfunction of the latch circuit 20 can be prevented.

FIG. 7 shows a main part of a semiconductor integrated circuit that is a comparison example. FIG. 8 shows a timing chart of an initialization operation at the time of verification.

The comparison example shown in FIG. 7 has a reset signal generation circuit 70, a latch circuit 72 and a fuse terminal 74, which are similar to the ones shown in FIG. 1. However, unlike the embodiment shown in FIG. 1, the delay control terminal 32 is not provided. When the comparison example circuit is examined in the manner shown in FIG. 3, the operation time at the latch circuit 72 is extended to time T4, as shown in FIG. 8, according to the load that is connected to the fuse terminal 74. On the other hand, reset period T1 of the reset signal 71 is determined solely by delay elements in the reset signal generation circuit. Therefore, when an undefined potential at a LOW level on the fuse terminal 74 at the time when the power is turned on is raised to a HIGH level by the operation of the NAND gate 23, it takes time T4 that is longer than the reset period T1 shown in FIG. 8. As a result, the undefined potential LOW on the fuse terminal 74 is not initialized, and the undefined potential LOW is maintained. Consequently, the latch output 72 does not become to be a LOW level potential which is supposed to be obtained when the fuse element 75 is in the open state, and the undefined HIGH level potential is maintained.

Therefore, according to the comparison example, the potential on the fuse terminal 74 and the latch output 73 are not initialized and remain undefined. Consequently, electrical measurement cannot be accurately conducted.

In order to prevent the problem, the reset period T1 may be extended, such that the latch circuit 72 can stably operate during the verification process. However, in such a case, the delay circuit within the reset signal generation circuit 70 has to be made larger. Moreover, the power consumption by the latch circuit 72 during the normal use increases, resulting in a fatal disadvantage in cellular phones or the like.

FIG. 9 shows a main part of a semiconductor integrated circuit in accordance with a second embodiment of the present invention. The semiconductor integrated circuit shown in FIG. 9 is different from the circuit shown in FIG. 1 in that the circuit shown in FIG. 9 has a reset pulse generation circuit that is formed from a one-shot pulse generation circuit 80 and a pulse width variable circuit 90. Among the parts shown in FIG. 9, those having the same functions as in FIG. 1 are referred to with the same reference numbers and their detailed descriptions are omitted.

The one-shot pulse generation circuit 80 shown in FIG. 9 is composed of the same circuit elements as those of the reset signal generation circuit 10 shown in FIG. 1, and has an inverter 82, a delay circuit 83 and a NAND gate 84. The delay circuit 83 is not connected to a delay control terminal 32. Therefore, the one-shot pulse generation circuit 80 shown in FIG. 9 generates a one-shot pulse that has always a pulse width $T_A$ when an input signal 11 is inputted, as shown in FIG. 10.

The pulse width variable circuit 90 shown in FIG. 9 generates a reset signal 91 in which the one-shot pulse 81 having the pulse width $T_A$ is modified to have a wider pulse width $T_B$ or $T_C$, as shown in FIG. 10 or FIG. 11.

The pulse width variable circuit 90 has inverters 92 and 93, an RS (set.reset) latch circuit 96 composed of two NOR gates 94 and 95, and a delay circuit 97. The delay control terminal 32 is connected to an output line of the delay circuit 97.

FIG. 10 shows an initialization operation of the latch output during the normal use, and FIG. 11 shows an initialization operation of the latch output during the process for verifying a semiconductor integrated circuit. FIG. 10 and FIG. 11 correspond to FIG. 2 and FIG. 4, respectively. In FIGS. 10 and 11, the one-shot pulses 81 have the same pulse width $T_A$. However, due to differences in the loads which are connected to the delay control terminals 32, the pulse width $T_C$ of the reset signal shown in FIG. 11 is wider than the pulse width $T_B$ of the reset signal shown in FIG. 10. As a result, the second embodiment can provide similar effects that are achieved by the first embodiment.

The third embodiment modifies an input pulse that is inputted in the one-shot pulse generation circuit 10 or 90 shown in FIG. 1 or in FIG. 9, respectively. As shown in FIG. 12, an input terminal of the one-shot pulse generation circuit 10 (90) is connected to an output line of the OR gate 16. A power-on reset signal 17 and another signal 18 are inputted in, the OR gate 16.

When the power-on reset signal 17 becomes HIGH, and output of the OR gate 16 becomes HIGH, such that an input signal 11, described above with reference to the first and second embodiments is obtained.

In accordance with the third embodiment, the latch output is initialized a plurality of times by inputting the other signal at a HIGH level in the OR gate 16.

The one-shot pulse generation circuits 10 and 90 shown in FIGS. 1 and 9, respectively, generate a one-shot pulse only by a power-on reset signal, and therefore can initialize the latch output only once immediately after the power is turned on.

However, the semiconductor integrated circuit is likely to be affected by noises such as static electricity that flows in from the fuse terminal 34. The latch circuit may malfunction due to the noises, and the initialized latch data may be changed, resulting in malfunctions of the equipment. The malfunctions cannot be eliminated unless the power-on reset signal is activated by turning the power on again.

In this respect, the third embodiment regularly or irregularly performs initialization of the latch output a plurality of times from the time the power is turned on until the power is turned off.

The semiconductor integrated circuit shown in FIG. 1 or FIG. 9 may be connected to a micro-controller. While the micro-controller is operating, a signal outputted from the micro-controller can be used as the other signal 18. For example, when a memory is mounted in the semiconductor integrated circuit shown in FIG. 1 or FIG. 9, a write signal or a read signal can be used as the other signal 18. Alternatively, a test-mode release signal can be used as the other signal 18. These signals become active in a predetermined frequency during the operation period of the microcomputer, and therefore the latch output can be initialized in the same frequency.

When the power-on reset signal 17 and the other signal 18 are low-active, a NOR gate may be used as one of logic circuits, in place of the OR gate.

Next, a semiconductor integrated circuit in accordance with another embodiment of the present invention is applied to a liquid crystal driver IC, and a liquid crystal apparatus including the liquid crystal driver IC is mounted on an electronic apparatus. This embodiment will be described with reference to a cellular phone as an electronic apparatus.

The liquid crystal apparatus in accordance with the embodiment of the present invention has a structure shown in FIG. 13. The liquid crystal apparatus 100 has a liquid crystal panel in which liquid crystal 114 is enclosed between two glass substrates 110 and 112. A liquid crystal display driver IC 120 is mounted on one of the glass substrates 110. The glass substrate 110 and a printed circuit board 200 that mounts an MPU 210 are connected to one another by a connector (for example, an elastic connection member such as zebra rubber) 130. When the liquid crystal apparatus 100 shown in FIG. 13 is a light-transmissive type, a backlight or a sidelight may be mounted thereon. When it is a reflective type, the light source is not required.

The liquid crystal apparatus 100 is mounted in a cellular phone 300 in a manner that its liquid crystal display section 102 is exposed. The cellular phone 300 includes a receiver section 310, a transmission section 320, an operation section 330 and an antenna 340, in addition to the liquid crystal display section 102. The MPU 102 transmits command data and display data to the liquid crystal driver IC 120 based on data received by the antenna 340 and data inputted by operating the operation section 330, respectively.

FIG. 15 is a block diagram of a liquid crystal driver IC. As shown in FIG. 15, the liquid crystal driver IC 120 is equipped with components that are required for driving the liquid crystal, such as, for example, a power supply circuit 400, a display memory such as a display data RAM 402, a display driver such as a segment (SEG) driver 404 and a common (COM) driver 406, an oscillation circuit 408, and a display timing generation circuit 410. The display data RAM 402 has memory elements in the same number of pixels (132×65) that are formed at intersections of 132 segment electrodes SEG0–SEG131 and 65 common electrodes COM0–COM64.

The liquid crystal display driver IC 120 further includes an MPU interface 412, a command decoder 414 and an internal bus 416. Command data decoded by the command decoder 414 are used as operation commands for operating the power supply circuit 400 and the display timing generation circuit 410, and also used for designating addresses of a page address circuit 420, a column address circuit 422 and a line address circuit 424 that are connected to the display data RAM 402.

On the other hand, parallel display data are transmitted through the internal bus 416 and an I/O buffer 426 of the display data RAM 402 and written in the memory elements of the display data RAM 402 according to page and column addresses designated by the commands.

The display data RAM 402 functions as a field memory or a frame memory for the liquid crystal display section. Display data written in the display data RAM 402 are address-designated and read out according to timing signals provided by the display timing generation circuit 410, and latched by a display data latch circuit 428. The display data latched by the display data latch circuit 428 is converted to potentials of five different levels V1–V5, for example, by the segment (SEG) driver 404 for driving the liquid crystal, and supplied to the segment electrodes SEG0–SEG131 of the liquid crystal display section.

The potentials are supplied to the segment electrodes SEG0–SEG131, while the common electrodes COM0–COM64 are selectively switched by the common (COM) driver 406 based on the timing signal provided by the display timing generation circuit 410, such that the liquid crystal display section is driven for display.

The liquid crystal driver IC 120 is provided with a verification circuit 430. The verification circuit 430 transmits signals (for example, the input signal 11) that are required for verification of the power supply circuit 400 and the display timing generation circuit 410 in the verification mode. Furthermore, the verification circuit 430 takes outputs from the circuits 400 and 410 and outputs them externally through an MPU interface 412 so as to enable monitoring the outputs.

The circuits shown in FIG. 1 or FIG. 9 can be provided, for example, in the power supply circuit 400 and the display timing generation circuit 410 within the liquid crystal display driver IC 120 shown in FIG. 15.

FIG. 16 and FIG. 17 respectively show example circuits of a reset signal generation circuit and a latch circuit, respectively provided in the power supply circuit 400 and the display timing generation circuit 410.

FIG. 16 shows a plurality of latch circuits, for example, four latch circuits 20A–20D. A reset signal 12 from one reset signal generation circuit 10 shown in FIG. 1 is inputted in each of the latch circuits. Each of the latch circuits 20A–20D is equipped with a fuse element 22, in which the fuse elements are short-circuited or opened to provide latch data of $2^4$=16 different combinations.

FIG. 16 further shows a liquid crystal reference voltage generation circuit 500, an IC reference voltage generation circuit 502 and a liquid crystal drive voltage generation circuit 504.

The liquid crystal reference voltage generation circuit 500 generates liquid crystal reference voltages Vref based on four-bit latch outputs 21A–21D provided from the four latch circuits 20A–20D and an IC reference voltage provided from the IC reference voltage generation circuit 502. The liquid crystal drive voltage generation circuit 504 generates liquid crystal driving voltages in a plurality of levels, V0 (VDD)–V5, based on the liquid crystal reference voltages Vref. The liquid crystal driving voltages may be generated by the use of resistance divisions, or a charge-pump type step-up voltage circuit.

FIG. 17 shows a circuit that adjusts an alternating signal FR for alternately drive the liquid crystal. The circuit shown in FIG. 17 is provided within the display timing generation circuit 410.

Referring to FIG. 17, an alternating current signal generation circuit 510 is formed from an RC oscillation circuit that can variably change the oscillation frequency based on the four-bit latch outputs 21A–21D provided from the four latch circuits 20A–20D.

The liquid crystal reference voltage Vref and the alternating current signal FR are adjustable because of the following reasons.

The liquid crystal reference voltage Vref is formed based on an IC reference voltage that has a relatively high level (±8–10%) of voltage deviations. On the other hand, the permissible variations for the liquid crystal reference voltage Vref are ±1%. When the variations of the liquid crystal reference voltages Vref are large, the contrast of the liquid crystal display screen lowers, and the light-dark gradation becomes irregular.

Next, the alternating current signal needs to have a frequency of 80 Hz±10%. When the frequency of the alternating current lowers to a level equivalent to the driving frequency for fluorescent lamps that is 50/60 Hz, the liquid crystal display screen starts flickering. On the other hand, when the frequency of the alternating current increase to a level of 100/120 Hz, flickering occurs, and the power consumption increases.

An RC oscillation circuit has a relatively high level of capacitance (C) accuracy. However, variations in its resistance value (R) amounts for ±15–20%. Therefore, when variations in the transistor performance are added, variations in the oscillation output can reach as much as ±30%.

Therefore, the liquid crystal reference voltage Vref and the alternating current signal FR need to be adjustable. FIG. 18 shows a flow chart illustrating a method for adjusting the liquid crystal reference voltage Vref. This method is conducted as one of the electric characteristic verification tests for the semiconductor integrated circuit described above, while the probes 40 are brought in contact with all of the pad terminals of the liquid crystal driver IC (in the form of a semiconductor wafer).

Referring to FIG. 18, in step 1, voltages on the four fuse terminals 34 are monitored while the four fuses 22 are not cut. Then, the liquid crystal reference voltage Vref that is generated by the liquid crystal reference voltage generation circuit 500 is monitored (step 2). This voltage can be taken out externally from the power supply circuit 400 shown in FIG. 15 through the verification circuit 416 and the MPU interface 412.

In step 3, the monitored results are compared with target values. If there are differences determined in step 4, a determination is made as to which one of the fuse elements 22 is to be cut in step 5.

Then, one or more of the fuse elements 22 determined in step 5 are cut in the manner described above (step 6).

Then, voltages on the fuse elements 22 that are cut and the voltages on the fuse elements 22 that remain connected are monitored (step 7). The corresponding voltages monitored in step 1 and step 7 are compared with one another (step 8), to thereby determine whether or not the fuse elements 22 are cut (step 9). If the determination in step 9 is YES, the liquid crystal driving reference voltage Vref is monitored again after the fuse element 22 is cut (step 10). If the monitored result is within the target value range (YES in step 11), the adjustment of the liquid crystal driving reference voltage Vref is completed.

The method for adjusting the frequency of the alternating signal is conducted in a similar manner as that shown by the flow chart in FIG. 18.

In step 1 and step 7 shown in FIG. 18, the voltage on the fuse terminal 34 is monitored. Before step 1 and step 7 are conducted, the latch output described above is initialized. As a result, the monitoring of voltages on the fuse terminals 34 can be accurately conducted in step 1 and step 7.

It is noted that the present invention is not limited to the embodiments described above, and a variety of modifications can be made within the subject matter of the invention.

For example, in the various embodiments described above, the reset signal generation circuit includes a one-shot pulse generation circuit. If an input signal itself has a pulse width, the reset signal generation circuit can be composed only of a pulse width variable circuit.

Also, in the example shown in FIG. 1, the delay control terminal 32 may not necessarily be the one that is connected to the output line of the delay circuit 14. For example, it may be connected to an input line of the delay circuit 14. In this case, the output impedance of the inverter 13 in a stage preceding the connection point and the load that is connected to the delay control terminal 32 are factors for varying the length of the reset period of the reset signal.

It is noted that the fuse element is one example of devices for determining the logic of the latch output, and the fuse element may be replaced for another device.

Furthermore, the semiconductor integrated circuit of the present invention is not limited to the one that is used for the liquid crystal display, and can be applied to other devises in a variety of other utilities. The electronic apparatus of the present invention is not limited to the one that is used in cellular phones and can also be applied to a variety of other electronic apparatuses that implement the semiconductor integrated circuit and liquid crystal apparatus of the present invention.

What is claimed is:

1. A semiconductor integrated circuit having a power input means for receiving power when power is turned on, said semiconductor integrated circuit comprising:
   a reset signal generation circuit that generates a reset signal having a reset pulse width in response to an input signal that is inputted at least immediately after power is turned on;
   at least one latch circuit having an initialization circuit that initializes a latch output based on the reset signal;
   a first pad terminal that is connected to the reset signal generation circuit; and
   at least one second pad terminal that is connected to an output line of the initialization circuit, wherein
   the reset signal generation circuit has a delay circuit that variably sets the reset pulse width of the reset signal according to a load that is connected to the first pad terminal.

2. A semiconductor integrated circuit according to claim 1, wherein the first pad terminal is connected to an output line of the delay circuit.

3. A semiconductor integrated circuit according to claim 1, wherein the first pad terminal is connected to an input line of the delay circuit.

4. A semiconductor integrated circuit according to claim 1, further comprising a fuse element that is connected to an output line of the initialization circuit, wherein the logic level of the latch output is dependent on whether said fuse element is in an open state or in a closed state.

5. A semiconductor integrated circuit according to claim 1, wherein:

the reset signal generation circuit includes a plurality of sub-circuits having respective output nodes each with a respective output impedance, said first pad terminal being coupled to the output node of at least a selected one of said sub-circuits such that the output impedance of the selected sub-circuit and the impedance said first pad terminal combined to establish a first slew rate for the rise and fall times of the selected sub-circuit's output node; and the impedance of the output line of the initialization circuit and the impedance of the second pad terminal combined to establish a second slew rate for the rise and fall times of said output line, said first slew rate being lower than said second slew rate.

6. A semiconductor integrated circuit according to claim 1, wherein the reset signal generation circuit includes a one-shot pulse generation circuit that generates a one-shot reset signal having a pulse width corresponding to the reset pulse width of the reset signal and formed by the delay circuit delaying the input signal.

7. A semiconductor integrated circuit according to claim 1, wherein
the reset signal generation circuit further includes:
a one-shot pulse generation circuit that generates a one-shot pulse based on the input signal; and
a pulse width variable circuit that includes the delay circuit and changes the pulse width of the one-shot pulse according to a load that is connected to the first pad terminal.

8. A semiconductor integrated circuit according to claim 1, wherein the input signal applied to the reset signal generation circuit alternates logic levels a plurality of times during a period from a time immediately after the power is turned on to a time when the power is turned off.

9. A semiconductor integrated circuit according to claim 1, further comprising a reference frequency generation circuit that generates a reference frequency based on the latch output.

10. A semiconductor integrated circuit according to claim 9, wherein an output frequency of the reference frequency generation circuit is used as an alternating signal that alternately drives a liquid crystal.

11. A semiconductor integrated circuit device comprising:
a semiconductor integrated circuit having a power input means for receiving power when power is turned on, said semiconductor integrated circuit including:
a reset signal generation circuit that generates a reset signal having a reset pulse width in response to an input signal that is inputted at least immediately after power is turned on, wherein said input signal alternates logic levels a plurality of times during a period from a time immediately after the power is turned on to a time when the power is turned off;
at least one latch circuit having an initialization circuit that initializes a latch output based on the reset signal;
a first pad terminal that is connected to the reset signal generation circuit; and
at least one second pad terminal that is connected to an output line of the initialization circuit, wherein
the reset signal generation circuit has a delay circuit that variably sets the reset pulse width of the reset signal according to a load that is connected to the first pad terminal; and
an OR gate that takes the logical sum of a power-on signal and a predetermined signal for controlling initialization of said latch circuit, wherein the output of said OR gate is said input signal that is provided to said reset signal generation circuit.

12. A semiconductor integrated circuit device comprising:
a semiconductor integrated circuit having a power input means for receiving power when power is turned on, said semiconductor integrated circuit including:
a reset signal generation circuit that generates a reset signal having a reset pulse width in response to an input signal that is inputted at least-immediately after power is turned on;
at least one latch circuit having an initialization circuit that initializes a latch output based on the reset signal;
a first pad terminal that is connected to the reset signal generation circuit; and
at least one second pad terminal that is connected to an output line of the initialization circuit, wherein
the reset signal generation circuit has a delay circuit that variably sets the reset pulse width of the reset signal according to a load that is connected to the first pad terminal; and
a reference voltage generation circuit that generates a reference voltage based on the latch output.

13. A semiconductor integrated circuit device according to claim 12, further comprising a liquid crystal driving voltage generation circuit that generates a liquid crystal driving voltage in a plurality of levels based on, an output voltage from the reference voltage generation circuit.

14. A liquid crystal apparatus comprising:
a liquid crystal driver IC having a power input means for receiving power when power is turned on, said liquid crystal driver IC being formed from a semiconductor integrated circuit including:
a reset signal generation circuit for generating a reset signal having a reset pulse width in response to an input signal that applied at least immediately after power is turned on;
at least one latch circuit having an initialization circuit for initializing a latch output in response to said reset signal;
a first pad terminal coupled to said reset signal generation circuit; and
at least one second pad terminal coupled to an output line of said initialization circuit, wherein said reset signal generation circuit includes a delay circuit that variably sets the reset pulse width of said reset signal according to a load applied to said first pad terminal; and
a liquid crystal panel that is driven by the liquid crystal driver IC.

15. An electronic apparatus comprising:
a liquid crystal apparatus having a power input means for receiving power when power is turned on, said liquid crystal driver IC being formed from a semiconductor integrated circuit including:
a reset signal generation circuit for generating a reset signal having a reset pulse width in response to an input signal that applied at least immediately after power is turned on;
at least one latch circuit having an initialization circuit for initializing a latch output in response to said reset signal;
a first pad terminal coupled to said reset signal generation circuit; and
at least one second pad terminal coupled to an output line of said initialization circuit, wherein said reset signal generation circuit includes a delay circuit that variably sets the reset pulse width of said reset signal according to a load applied to said first pad terminal; and a liquid crystal panel that is driven by the liquid crystal driver IC.

16. A method for testing a semiconductor integrated circuit, the method comprising:

a first step of contacting a probe to a first pad terminal coupled to a delay circuit of the semiconductor integrated circuit, wherein said delay circuit produces a first delay time when no probe is in contact with said first pad and a producing a second delay time when said probe is in contact with said first pad, said second delay time being greater than said first delay time;

a second step of generating, by a reset signal generation circuit in the semiconductor integrated circuit, a reset signal having a pulse width dependent on the delay time produced by said delay circuit;

a third step of initializing a latch output, in at least one latch circuit having an initializing circuit, by the initializing circuit based on the reset signal; and a fourth step of monitoring an output voltage of the initialization circuit by means of a second pad terminal.

17. A method for testing a semiconductor integrated circuit according to claim 16, further comprising:

a fifth step of monitoring a reference signal that is set based on an initialized latch output; and a sixth step of cutting a fuse element that is connected to an output line of the initialization circuit based on a monitoring result conducted in the fifth step.

18. A method for testing a semiconductor integrated circuit according to claim 17, further comprising, after the sixth step, a seventh step of monitoring through the second pad terminal an output of the initialization circuit that is modified by the cut fuse element.

19. A method for testing a semiconductor integrated circuit according to claim 17, wherein the reference signal that is monitored in the fifth step has a reference voltage for generating liquid crystal driving voltages in a plurality of levels.

20. A method for testing a semiconductor integrated circuit according to claim 17 wherein, the reference signal that is monitored in the fifth step is an alternating signal for alternately driving the liquid crystal.

21. A semiconductor integrated circuit having a test operation mode and a normal operation mode, said semiconductor integrated circuit comprising:

a reset input node for receiving a reset signal;

a reset signal generation circuit for generating a reset pulse signal in response to said reset signal, said reset pulse signal having a first pulse width when said semiconductor circuit is in said test operation mode and having a second pulse width when said semiconductor circuit is in said normal operation mode, said first pulse width being longer than said second pulse width;

a latch circuit coupled to receive said reset pulse signal and having an output latch node, said latch further having a an intermediate node selectively coupled to a power rail through a fuse, said latch being effective for latching the logic value of said reset pulse signal and outputting the latched value on said output latch node when said fuse is blown, and being effective for ignoring said reset pulse signal and maintaining the logic value of said output latch node constant when said fuse is not blown.

22. The semiconductor integrated circuit of claim 21, wherein when said fuse is blown, said latch is characterized by a latch response time for latching the logic level of said reset pulse signal, said latch response time having a first time span when said semiconductor integrated circuit is in said test operation mode and having a second time span when said semiconductor circuit is in said normal operation mode, said first time span being longer than said second time span.

23. The semiconductor integrated circuit of claim 22, further having a first probe pad coupled to said intermediate node for receiving a test probe when said semiconductor integrated circuit is in said test operation mode, said test probe having a first capacitive load effective for setting said first time span of said latch response time.

24. The semiconductor integrated circuit of claim 23, further having a second probe pad coupled to said reset signal generation circuit for adjusting the length of said first pulse width of said reset pulse signal to assure that said first pulse width is greater than said first time span of said latch response time.

25. The semiconductor integrated circuit of claim 24, wherein said second probe pad has a predetermined load for creating a specific time constant sufficient for producing said first pulse width.

* * * * *